United States Patent
Connor et al.

(10) Patent No.: US 10,199,706 B2
(45) Date of Patent: *Feb. 5, 2019

(54) COMMUNICATION SYSTEM HAVING A MULTI-LAYER PCB INCLUDING A DIELECTRIC WAVEGUIDE LAYER WITH A CORE AND CLADDING DIRECTLY CONTACTING GROUND PLANES

(71) Applicant: International Business Machines Corporation, Armonk, NY (US)

(72) Inventors: Samuel R. Connor, Research Triangle Park, NC (US); Daniel M. Dreps, Georgetown, TX (US); Jose A. Hejase, Austin, TX (US); Joseph Kuczynski, North Port, FL (US); Joshua C. Myers, Austin, TX (US); Junyan Tang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 34 days.

This patent is subject to a terminal disclaimer.

(21) Appl. No.: 15/331,614

(22) Filed: Oct. 21, 2016

(65) Prior Publication Data

US 2018/0115042 A1   Apr. 26, 2018

(51) Int. Cl.
*H01P 3/16* (2006.01)
*H05K 1/02* (2006.01)
*H01P 3/12* (2006.01)

(52) U.S. Cl.
CPC ............. *H01P 3/16* (2013.01); *H05K 1/0243* (2013.01); *H01P 3/121* (2013.01); *H05K 1/024* (2013.01); *H05K 1/0216* (2013.01); *H05K 1/0298* (2013.01)

(58) Field of Classification Search
CPC .. H01P 3/16; H01P 3/121; H01P 1/022; H01P 5/103
USPC ............................................... 333/1, 239, 26
See application file for complete search history.

(56) References Cited

U.S. PATENT DOCUMENTS

| | | | |
|---|---|---|---|
| 4,792,774 A | 12/1988 | Walter et al. | |
| 4,800,350 A * | 1/1989 | Bridges et al. | ........... H01P 3/16 333/239 |
| 6,832,081 B1 | 12/2004 | Hiramatsu et al. | |
| 9,093,732 B2 | 7/2015 | Bae et al. | |
| 9,112,253 B2 | 8/2015 | Payne et al. | |
| 9,246,230 B2 | 1/2016 | Apostolos et al. | |
| 9,350,063 B2 | 5/2016 | Herbsommer et al. | |
| 2002/0027481 A1* | 3/2002 | Fiedziuszko | ............ H01P 1/203 333/116 |
| 2013/0154759 A1* | 6/2013 | Morita et al. | ........... H01P 3/081 333/26 |
| 2013/0265732 A1* | 10/2013 | Herbsommer et al. | ..................... H05K 1/0243 361/774 |
| 2015/0295297 A1 | 10/2015 | Cook et al. | |

(Continued)

*Primary Examiner* — Benny Lee

(57) ABSTRACT

Embodiments herein describe a high-speed communication channel in a PCB that includes a dielectric waveguide sandwiched between two ground layers. The dielectric waveguide includes a core and a cladding where the material of the core has a higher dielectric constant than the material of the cladding. Thus, electromagnetic signals propagating in the core are internally reflected at the interface between the core and cladding such that the electromagnetic signals are primary contained in the core.

17 Claims, 13 Drawing Sheets

(56) References Cited

U.S. PATENT DOCUMENTS

2015/0295298 A1\* 10/2015 Payne et al. ............. H01P 3/16
                                                       343/837
2015/0326336 A1  11/2015 Witschnig et al.

\* cited by examiner

COMMUNICATION SYSTEM HAVING A MULTI-LAYER PCB INCLUDING A DIELECTRIC WAVEGUIDE LAYER WITH A CORE AND CLADDING DIRECTLY CONTACTING GROUND PLANES

BACKGROUND

The present invention relates to a dielectric waveguide in a multi-layer printed circuit board (PCB).

Computing systems rely on high speed buses to transmit data between different components—e.g., processors, memory, accelerators, I/O devices, graphics cards, and the like. Differential signaling is primarily used for short high speed buses. In this technique, each signal line includes two wires which transmit opposite polarity signals. A receiver coupled to the two wires calculates the voltage difference between the wires to determine the data bit being transmitted. Using differential signaling rather than a single wire for each data bit significantly reduces the impact of noise and radiated emissions on the transmitted signal. However, as data speeds increase (e.g., greater than 25 Gb/s), the lengths at which a bus can effectively use differential signaling are reduced.

Fiber optics is another technique for transmitting data between computing devices at high speeds. Fiber optics can transmit signals at speeds above 100 Gb/s for much farther distances than a bus that uses differential signal. However, optical transmitters and receivers are expensive and require more space relative to the drivers and receivers used to perform differential signaling.

SUMMARY OF THE INVENTION

One embodiment of the present disclosure is a multi-layer printed circuit board (PCB) including a first dielectric layer, a first ground layer including a first conductive material, and a dielectric waveguide layer including a first core and a cladding. Further, the cladding is disposed on at least two sides of the first core and where an insulative material of the first core has a higher dielectric constant than an insulative material of the cladding. The PCB includes a second ground layer including a second conductive material where the first ground layer is disposed between the first dielectric layer and the dielectric waveguide layer and where the first core and cladding both directly contact the first and second ground layers.

Another embodiment described herein is a communication system that includes a multi-layer PCB that includes a first dielectric layer, a first ground layer including a first conductive material, and a dielectric waveguide layer including a first core and a cladding where the cladding is disposed on at least two sides of the first core and where an insulative material of the first core has a higher dielectric constant than an insulative material of the cladding. The PCB also includes a second ground layer including a second conductive material where the first ground layer is disposed between the first dielectric layer and the dielectric waveguide layer and where the first core and cladding both directly contact the first and second ground layers. The communication system further includes a first application specific integrated circuit (ASIC) coupled to the multi-layered PCB where the first ASIC is configured to transmit an electromagnetic signal into the first core and a second ASIC coupled to the multi-layered PCB where the second ASIC is configured to receive the electromagnetic signal from the first core.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION OF THE INVENTION

Embodiments herein describe a high-speed communication channel in a PCB that includes a dielectric waveguide. The dielectric waveguide includes a core and a cladding where the material of the core has a higher dielectric constant than the material of the cladding. Thus, electromagnetic signals propagating in the core are internally reflected at the interface between the core and cladding such that the electromagnetic signals are primarily contained in the core. In one embodiment, the dielectric waveguide is coupled at respective ends to coaxial vias that each include a center conductor and an outer conductor (or shield) which extend through one or more layers of the PCB. One of the coaxial vias radiates electromagnetic signals into the dielectric waveguide at a first end of the core while the other coaxial via receives the radiated signals at a second end of the core. For example, the center conductor extends into the core of the dielectric material and functions like an antenna to radiate the electromagnetic signal into the core. After traveling through the dielectric waveguide, the electromagnetic signal reaches the center conductor of another coaxial via which receives the signal. In one embodiment, the center conductors of the coaxial vias are bonded to respective integrated circuits (e.g., processors or application specific integrated circuits (ASICs)) mounted on the PCB. The integrated circuits can use the coaxial vias and dielectric waveguide to transmit high speed data signals (e.g., greater than 70 Gb/s) between each other.

Figure 1:
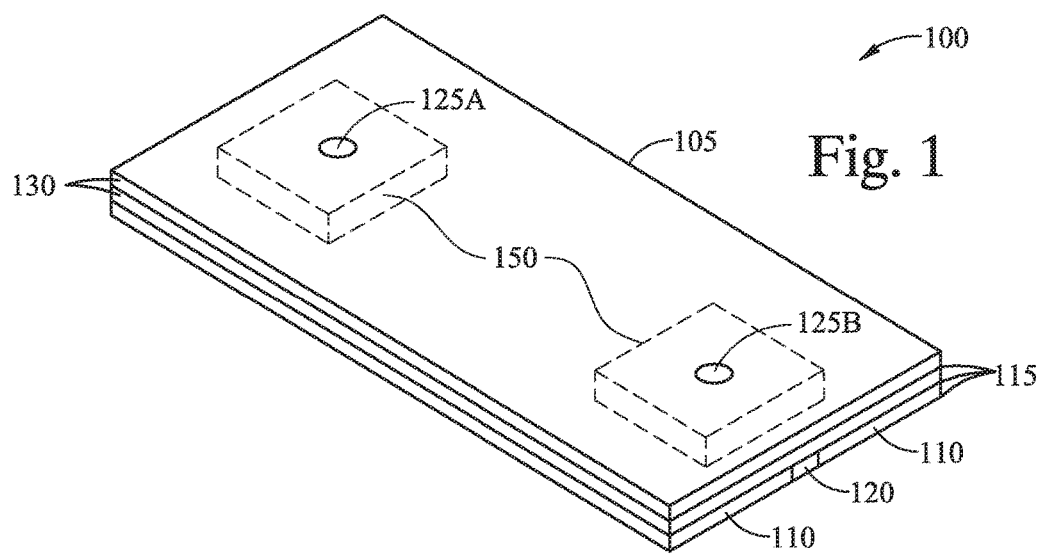
FIG. 1 illustrates a multi-layer PCB with a dielectric waveguide, according to one embodiment described herein.

FIG. 1 illustrates a communication system 100 that includes a multi-layer PCB 105 with a dielectric waveguide, according to one embodiment described herein. As shown, the PCB 105 includes multiple dielectric layers 130 that are separated by ground layers 115. The dielectric layers 130 can be any rigid insulative material that can provide support for the components mounted to the PCB 105. However, the various layers shown in FIG. 1 can form either a rigid PCB that is not intended to bend or curve, or a flexible PCB (i.e., a flex PCB) in which case the dielectric layers 130 and ground layers 115 are able to bend without breaking. The ground layers 115 can be conductive layers—e.g., copper sheets.

In one embodiment, the material of the core 120 and the cladding 110 is a polymer or a composite material. For example, the core 120 and the cladding 110 may be formed by photoresists which have the requisite dielectric constants for guiding an electromagnetic wave. The photoresists can be applied onto the multi-layer PCB 105 to form the dielectric waveguide using different fabrication steps. In one embodiment, the core 120 has a dielectric permittivity of 4.5 at 40 GHz and loss tangent of 0.0086 also at 40 GHz. In one embodiment, the cladding 110 can be air or any other low dielectric constant material (in case of air the dielectric permittivity is 1 at all frequencies and loss tangent is 0; in case of, for example, Teflon (e.g. polytetrafluoroethylene (PTFE)) the dielectric permittivity is 2.1 and loss tangent is 0.001 at 10 GHz). Generally, the cladding 110 has a lower permittivity than the core 120 and both should be low loss. A higher permittivity difference will provide better guiding but will also increase attenuation per unit distance due to wavelength compression. Non limiting examples include the use of polytetrafluoroethylene (PTFE) for the cladding 110 and a polyphenylene oxide-based resin as the core 120.

The bottom layer of the PCB 105 includes the core 120 and the cladding 110 sandwiched between two ground layers 115. In this embodiment, the material of the cladding 110 takes up the entire bottom layer of the PCB 105 except for the portion that includes the core 120. However, in another embodiment, the bottom layer can include a third material where the cladding 110 is disposed between the third dielectric material and the core 120. For example, the third material may be more rigid than the materials of either the core 120 or the cladding 110, and thus, is added in the bottom layer to improve the structural integrity of the PCB 105.

The communication system 100 includes respective coaxial vias 125A and 125B that couple the core 120 of the dielectric waveguide (i.e., the bottom layer of the PCB 105) to an external component such as a processor or ASICs 150 (shown as being transparent using ghosted lines). In one embodiment, the external components are coupled by solder (e.g., solder bumps) to pads on an outer surface of the PCB 105. The solder may be part of a ball grid array that couples multiple I/O pads on the external components to respective pads in the PCB 105. These pads are then coupled to the coaxial vias 125A and 125B to permit the PCB 105 to transmit electromagnetic signals to and/or receive electromagnetic signals from the external components.

Although FIG. 1 illustrates that the bottom layer of the PCB 105 includes only one dielectric waveguide, the dielectric waveguide may be only one of a plurality of communication channels between the external components coupled to the coaxial vias 125A and 125B. That is, the coaxial vias 125A and 125B and dielectric waveguide may be repeated in the PCB 105 to provide separate high-speed communication channels between external components. These communication channels may collectively form a high-speed bus.

In one embodiment, the electromagnetic signals transmitted using the communication system 100 have wavelengths that are greater than the wavelengths of electromagnetic signals in the visible light spectrum or infrared spectrum. That is, the wavelengths of the electromagnetic signals used in system 100 may be greater than 1000 microns. Because of the inverse relationship between wavelength and frequency, the frequencies of the electromagnetic signals used in communication system 100 may be less than the frequencies of the infrared spectrum—e.g., less than 300 GHz. By using frequencies less than infrared or visible light, expensive and bulky optical transmitters and receivers can be avoided.

Although FIG. 1 illustrates only one dielectric waveguide which facilitates high-speed communication between two external components, the multi-layer PCB 105 can be used to facilitate high speed communication between many different computing devices. For example, the PCB 105 may be part of a motherboard in a computing system that couples processors to each other as well as other periphery devices such as a graphics card, main memory, network controller, accelerators, and the like. Each of these connections may be facilitated by using one or more of the communication channels established by the dielectric waveguide and the pair of coaxial vias 125.

Figure 2:
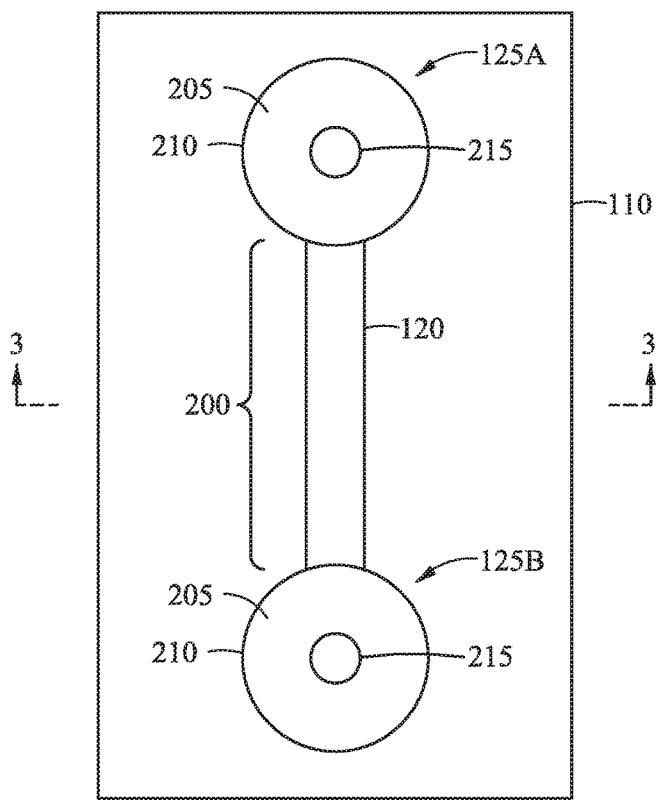
FIG. 2 illustrates a dielectric waveguide coupled to coaxial vias, according to one embodiment described herein.

FIG. 2 illustrates a dielectric waveguide 200 coupled to coaxial vias 125A and125B , according to one embodiment described herein. FIG. 2 illustrates a top down view of the dielectric waveguide 200 where any dielectric layer or grounding layers above the waveguide 200 have been removed. As shown, the dielectric waveguide 200 includes the core 120 and cladding 110. The dielectric material of the core 120 has a higher dielectric constant than the dielectric material of the cladding 110. In one embodiment, the core 120 and cladding 110 directly contact such that there is no air gap between the two materials. Thus, electromagnetic signals propagating in the core 120 are reflected at the interface between the core 120 and cladding 110 such that the power of the electromagnetic signal is contained primarily within the core 120 (although some leakage may occur).

Any dielectric material can be used for the core 120 and the cladding 110 so long as the dielectric constants have the relationship described above. Further, if used in a rigid rather than a flexible multi-layer PCB, the dielectric material may have sufficient rigidity to provide support for the other layers in the PCB as well any components or devices mounted onto the PCB. Furthermore, the same dielectric material used for either the core 120 or the cladding 110 can also be used to form the other dielectric layers in the multi-layer PCB—e.g., dielectric layers 130 shown in FIG. 1.

The coaxial vias 125A and 125B each includes a center conductor 215 electrically insulated from an outer conductor 210 (e.g., a shield) by a dielectric 205. As described above, the center conductor 215 can be coupled to a respective pad to receive electromagnetic signals from, or transmit electromagnetic signals to, an external component. For example, an ASIC may use a solder connection to drive an electromagnetic data signal onto the center conductor 215 of coaxial via 125A. The center conductor 215 introduces the electromagnetic data signal into the dielectric waveguide 200 which guides the signal to a center conductor 215 of the coaxial via 125B. While the center conductor 215 is used to transmit the data signal, the outer conductor 210 is grounded. Moreover, the outer conductors 210 can be coupled to the ground layers 115 shown in FIG. 1.

In one embodiment, the center conductor 215 extends through the outer conductor 210 to transmit electromagnetic signals into or out of the page. For example, the center conductor 215 in coaxial via 125A may transmit the electromagnetic signals into the core 120. Because of the difference in dielectric constants between the materials of the core 120 and the cladding 110, much of the power of the electromagnetic signal is contained within the core 120 as the signal travels down the core 120 to the coaxial via 125B. Once received by the center conductor 215 in coaxial via 125B, the center conductor 215 transmits the signal through the coaxial via 125B to a component or device coupled to the via 125B.

As shown, the outer conductor 210 surrounds the center conductor 215 in each of the coaxial vias 125. In one embodiment, both the outer conductor 210 and the center conductor 215 are cylindrical shape but can be any number of shapes (e.g., elliptical, rectangular, etc.). The outer conductor 210 forms an annular ring through which the center conductor 215 extends.

Figure 3:
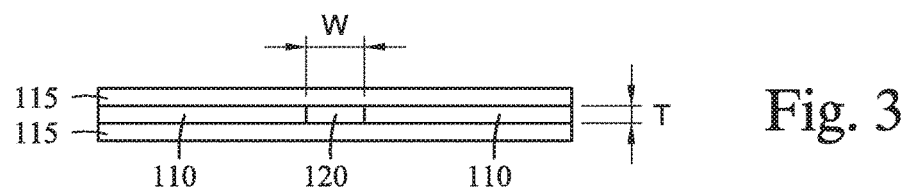
FIG. 3 is a cross section of the dielectric waveguide in FIG. 2, according to one embodiment described herein.

FIG. 3 is a cross section of the dielectric waveguide 200 along the dotted lines 3-3 in FIG. 2, according to one embodiment described herein. As shown, the core 120 and cladding 110 are sandwiched between a pair of ground layers 115. The material of the core 120 directly contacts the material of the cladding 110 such that there is no air gap between the materials. Similarly, the core 120 and cladding 110 directly contact the conductive material of the ground layers 115 (e.g., copper foil).

In one embodiment, the thickness (T) of the core 120 and cladding 110 is between 0.1 mm to 0.8 mm. The width (W) of the core 120 may be between 0.1 mm to 2 mm. The specific width and thickness of the core 120 can vary depending on the frequency or wavelength of the electromagnetic signal transmitted in the dielectric waveguide. For example, the core 120 may have a wider width if used to transmit signals with larger wavelengths. In one embodiment, the core 120 transmits electromagnetic signals that have frequencies less than the frequencies of visible light (e.g., less than 300 GHz). In one embodiment, the core 120 transmits electromagnetic signals with a range between 10 GHz to 200 GHz. In one embodiment, the core 120 transmits electromagnetic signals with a range between 20 GHz to 150 GHz. In one embodiment, the core 120 transmits electromagnetic signals with a range between 30 GHz to 100 GHz.

Although FIGS. 1, 2, and 3 illustrate using the coaxial vias into the dielectric waveguide 200, the simulations below are not limited to introducing electromagnetic signals into the core 120 using coaxial vias. Instead, the designs and functions describe below can be used with any suitable port excitation to introduce the electromagnetic signals into the dielectric waveguides.

Figure 4A:
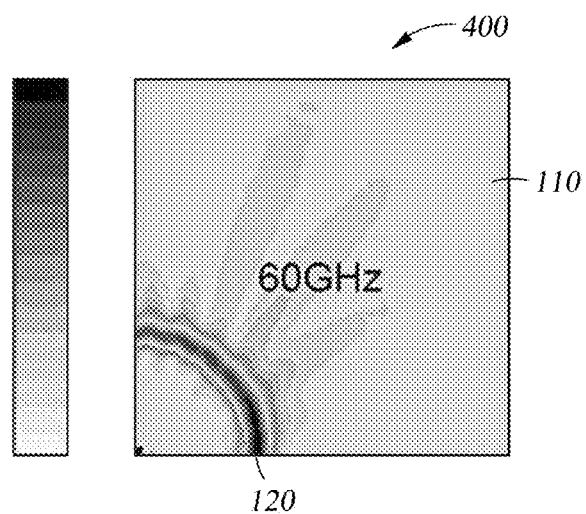
FIGS. 4A-4C illustrate intensities of electromagnetic signals with different frequencies transmitted in a dielectric waveguide, according to embodiments described herein.
Figure 4B:
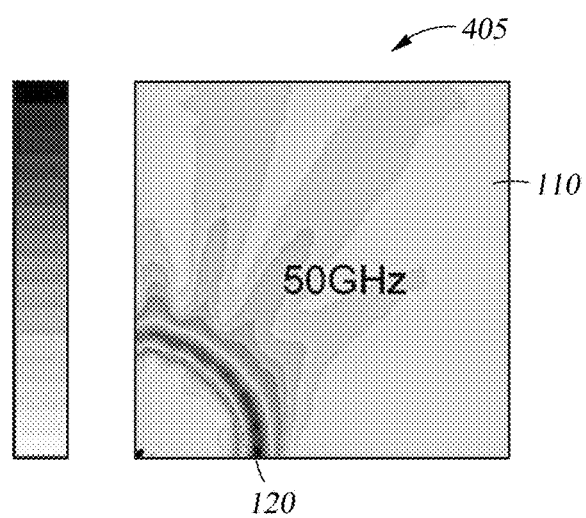
Figure 4C:
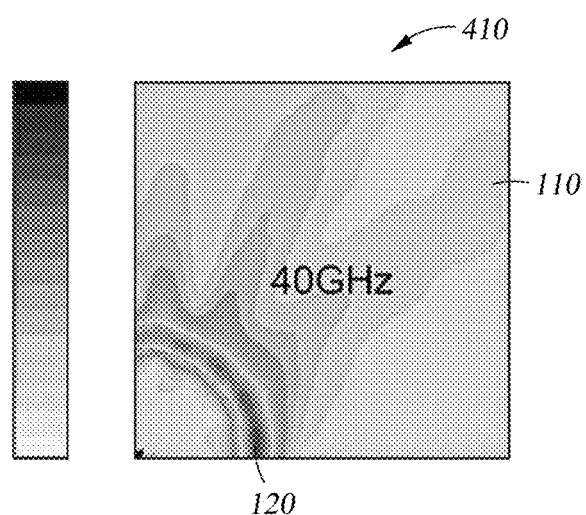

FIGS. 4A-4C illustrate intensities of different frequency electromagnetic signals transmitted in a dielectric waveguide, according to embodiments described herein. Specifically, FIGS. 4A-4C illustrate a curved dielectric waveguide where the core 120 forms in an arc through the cladding 110. As such, electromagnetic signals that are inserted into the bottom of the core 120 travel along the arc until exiting on the left side of the chart 400 as shown in FIG. 4A. Although the difference in dielectric constants between the core 120 and the cladding 110 generate internal reflections which contain the electromagnetic signal primarily in the core 120, some of the electromagnetic signal leaks into the cladding 110 as shown by the charts 400, 405, and 410 as shown in FIG. 4A, 4B, and 4C, respectively. In simulations illustrated in FIGS. 4A-4C, the dielectric constant of the core 120 is 4.5 at 40 GHZ and the loss is 0.0086 at the same frequency while the assumed cladding is air.

Chart 400 illustrates in FIG. 4A the intensity of an electromagnetic signal in the core 120 and cladding 110 with a frequency of 60 GHz. Generally, the higher the frequency (i.e., the smaller the wavelength) the less leakage experienced by the electromagnetic signal as it traverses the arc formed by the core 120 (which has a length of 12.5 mm). Put differently, the 60 GHz electromagnetic signal illustrated in chart 400 is better contained within the core 120 than the 50 GHz electromagnetic signal illustrated in chart 405 as shown in Figure 4B and the 40 GHz electromagnetic signal illustrated in chart 410 as shown in FIG. 4C. Thus, a designer can discern from FIGS. 4A-4C that less leakage occurs for higher speed signals than lower speed signals.

The same principles and characteristics described below for an arced dielectric waveguide also apply to straight waveguides—i.e., where the core 120 does not bend or change directions when propagating through the dielectric waveguide layer as shown in FIG. 2. That is, even if the core 120 was straight, higher frequency signals experience less leakage into the cladding when traversing the waveguide than lower frequency signals.

Figure 5A:
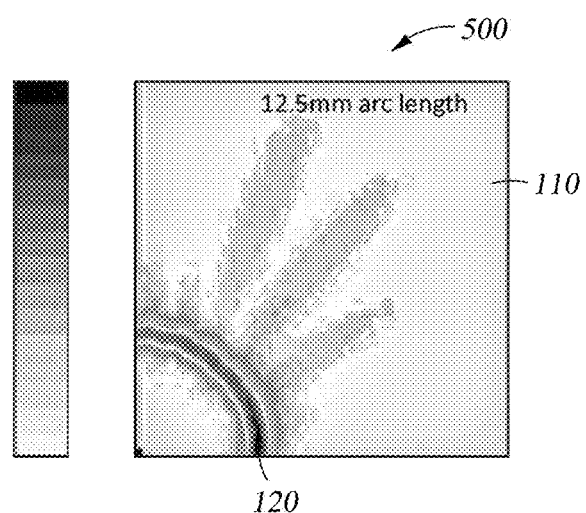
FIGS. 5A-5C illustrate intensities of an electromagnetic signal transmitted in dielectric waveguides with different lengths, according to embodiments described herein.
Figure 5B:
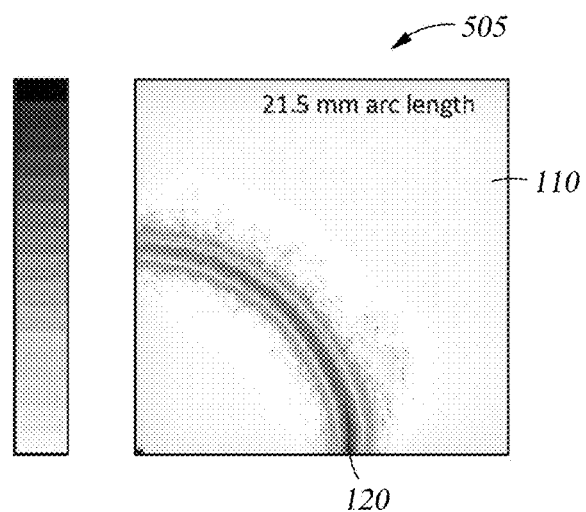
Figure 5C:
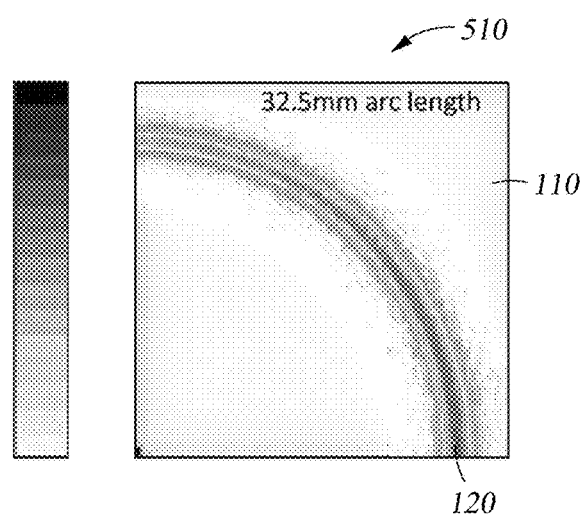

FIGS. 5A-5C illustrate intensities of an electromagnetic signal transmitted in dielectric waveguides with different lengths, according to embodiments described herein. In charts 500, 505, and 510 as shown in FIG. 5A, 5B, and 5C, respectively, the frequency (and wavelength) of the electromagnetic signal transmitted in the cores 120 is the same— e.g., 60 GHz in this example. However, the radiuses or lengths of the arcs formed by the cores 120 change. Specifically, in FIG. 5A, the length of the core 120 is 12.5 mm with an arc radius of 25/π. In FIG. 5B, the length of the core 120 is 21.5 mm with an arc radius of 43/π. In FIG. 5C, the length of the core 120 is 32.5 mm with an arc radius of 65/π.

As shown, the amount of leakage from the core 120 into the cladding 110 reduces as the length of the cores increases. Put differently, as the radius of the arc made by the core 120 increases, the leakage from the core 120 to the cladding 110 decreases, and vice versa. Thus, sharper turns or twists in the core 120 results in greater leakage into the cladding 110. However, FIGS. 5A-5C also illustrate that if a designer wants to avoid sharp turns, the length of the core 120 must be increased. But increasing the length of the core 120 also increases the loss due to the inherent attenuation resulting from transmitting electromagnetic signals in the dielectric waveguide. That is, longer waveguides have larger inherent losses than shorter waveguides. Thus, increasing the length of the waveguides when designing the waveguide in order to reduce the loss due from a curve or turn in the core 120 should be balanced with the inherent loss of the waveguide which increases as the length of the waveguide increases.

Figure 6:
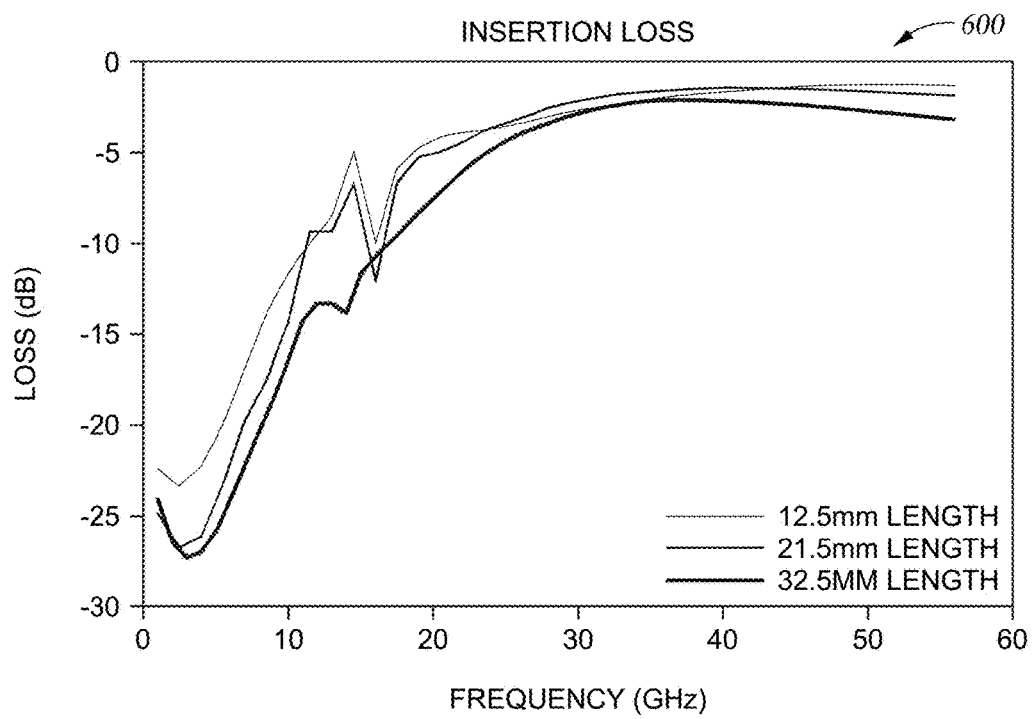
FIG. 6 is a chart illustrating the insertion loss of using dielectric waveguides with different lengths, according to one embodiment described herein.

FIG. 6 is a chart 600 illustrating the insertion loss of using dielectric waveguides with different lengths, according to one embodiment described herein. The X-axis of the chart 600 is frequency measured in gigahartz (GHz) while the Y-axis is loss measured in decibels (dB) The insertion loss is the total loss suffered by the electromagnetic signal when propagating through the dielectric waveguide. The insertion loss includes the inherent loss of the waveguide as well as losses due to the waveguide curving to form arcs.

In chart 600, the thinnest solid line represents the insertion loss of a 12.5 mm length arced waveguide as shown in FIG. 5A, the medium thickness line represents the insertion loss of the 21.5 mm length arced waveguide shown in FIG. 5B, and the thickest line represents the insertion loss of the 32.5 mm length arced waveguide shown in FIG. 5C across a plurality of frequencies. For example, around 33-35 GHz the 12.5 mm length arced waveguide has the poorest performance (worse insertion loss) of the three waveguides. However, as the frequency increases, the performance of the 12.5 mm length waveguide improves while the performance of the 21.5 mm and 32.5 mm length waveguides begin to worsen. This is because at lower frequencies the loss due to the small radius of the 12.5 mm length arced waveguide has a greater effect on the insertion loss. However, at higher frequencies, the loss due to the curvature of the waveguides matters less and instead the insertion loss is determined more by the overall length of the waveguides. Because the 12.5 mm length waveguide is the shortest, its insertion loss improves as the frequencies increase.

A designer can use chart 600 to select the best arc length or curvature for a given system. For example, the frequency range or ranges used by the system may be known—e.g., 60 GHz. By identifying the vertical line that corresponds to 60 GHz along the x-axis, the designer can identify the best curvature to use for the waveguides. In this case, the designer should select the 12.5 mm waveguide since the tighter curvature is less of a factor than the overall length of the waveguide at this frequency. However, if the system transmits data at 30 GHz, than the 21.5 mm arced waveguides has the best performance when curving the waveguides in the PCB.

Figure 7:
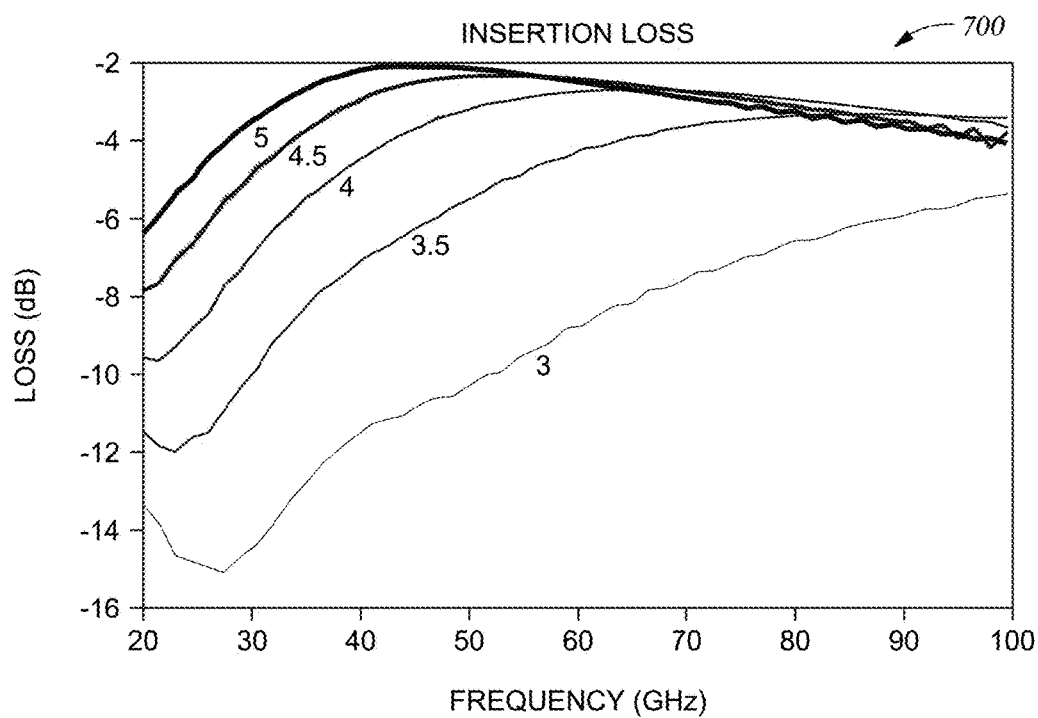
FIG. 7 is a chart illustrating the insertion loss of using cores in a dielectric waveguide with different dielectric constants, according to one embodiment described herein.

FIG. 7 is a chart 700 illustrating the insertion loss in dB of using cores in a dielectric waveguide with different dielectric constants (e.g., 3, 3.5, 4, 4.5, and 5,) according to one embodiment described herein with Frequency (Ghz) along the x-axis and Loss (dB) along the y-axis. Specifically, the chart 700 illustrates varying the dielectric constant of a 21.5 mm arced core as shown in FIG. 5B. It is assumed that the dielectric constant of the cladding is 2.1 and loss of 0.001 at 10 GHz. Moreover, while the chart 700 illustrates varying the dielectric constant, the dielectric loss of the material is constant—i.e., 0.0086—for the five different plots shown.

For frequencies below 50 GHz, as the dielectric constant is increased, the insertion loss of the 21.5 mm waveguide is decreased—i.e., performance improves. This is because a greater contrast between the dielectric constants of the core and cladding improves internal reflection and mitigates leakage. Thus, improving the contrast between the dielectric constants of the core and cladding can reduce the insertion loss. However, increasing the dielectric constant results in more loss per unit distance. For higher frequencies (i.e., frequencies over 60 GHz), using the higher dielectric constant (e.g., 5) may lead to worse performance than using a lower dielectric constant (e.g., 4.5 or 4). Again, a designer can select the optimal dielectric constant for the core by first selecting the frequency the system use to transmit digital data and then selecting the dielectric constant that results in the lowest insertion loss at that frequency.

Figure 8:
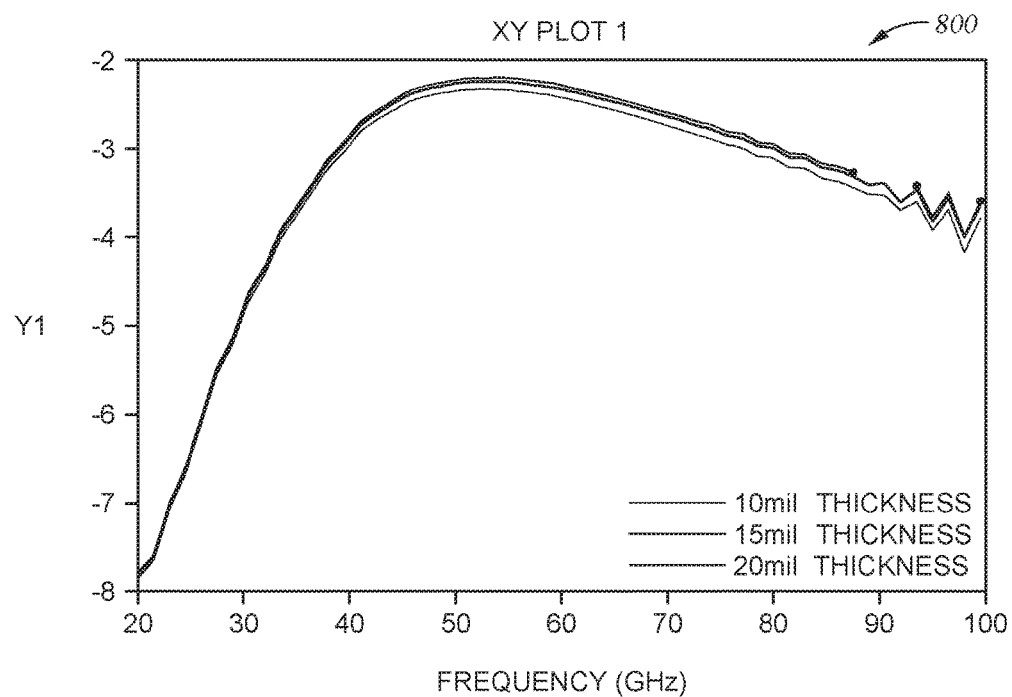
FIG. 8 is a chart illustrating the insertion loss of using different thickness dielectric waveguides, according to one embodiment described herein.

FIG. 8 is a chart 800 illustrating the insertion loss of using different thickness dielectric waveguides, according to one embodiment described herein. Referring to FIG. 3, the thickness (T) is the vertical distance between the ground layers 115 that sandwiches the core 120 and cladding 110 on opposite sides. In chart 800, the three plots, e.g. XY PLOT1, illustrate the insertion loss Y1 along the y-axis in relation to Frequency (Ghz) along the x-axis for a dielectric waveguide that has a 10 mil thickness, a 15 mil thickness, and a 20 mil thickness. As shown, across the frequency range, the thickness of the dielectric waveguide has a minor effect on the insertion loss. Thus, the thickness can be chosen to suit the particular implementation of the PCB without having a significant impact on performance. As chart 800 illustrates, the performance of the dielectric waveguide does not vary much when the PCB layers are thick or thin. In chart 800, the dielectric constant of the core is 4.5 at 40 GHZ and the loss is 0.0086 at the same frequency while the assumed cladded is air.

Figure 9:
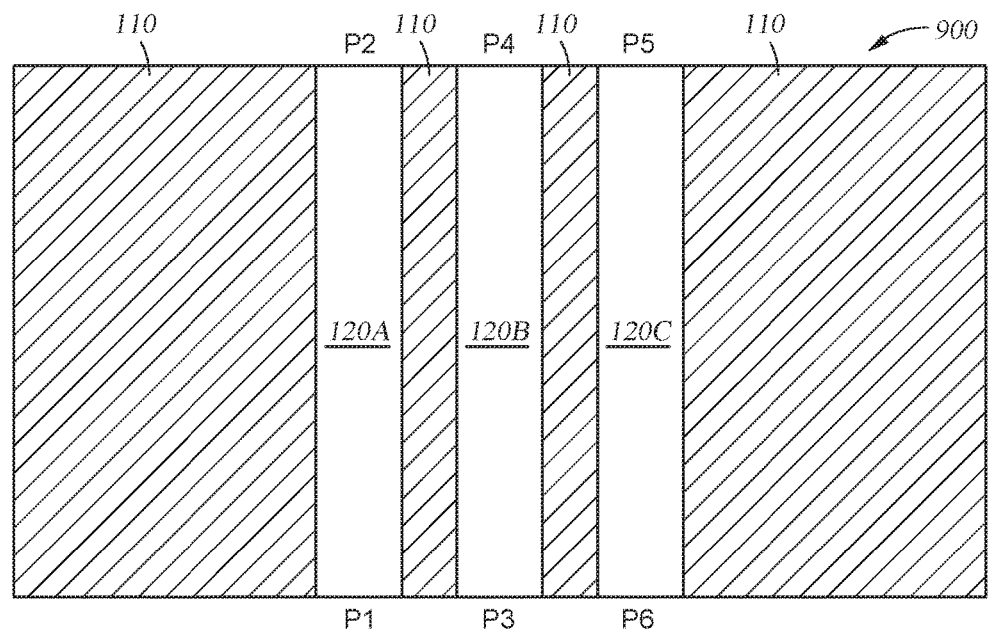
FIG. 9 illustrates a layer in a PCB that includes multiple dielectric waveguides, according to one embodiment described herein.

FIG. 9 illustrates a dielectric waveguide layer 900 in a multi-layer PCB that includes multiple dielectric waveguides, according to one embodiment described herein. As shown, the dielectric waveguide layer 900 includes three cores 120A, 120B, and 120C that are surrounded on two sides by the cladding 110 which form three separate waveguides. That is, the communication system can user the three waveguides to transmit the same or different electromagnetic signals properties. However, due to the close physical proximity of the cores 120A, 120B, and 120C, the three waveguides may experience cross talk where transmitting an electromagnetic signal in one core affects the performance of a neighboring core 120A, 120B, and 120C.

FIG. 9 illustrates a dielectric waveguide layer 900 in a multi-layer PCB that includes multiple dielectric waveguides, according to one embodiment described herein. As shown, the dielectric waveguide layer 900 includes three cores 120 that are surrounded on two sides by the cladding 110 which form three separate waveguides. That is, the communication system can use the three waveguides to transmit the same or different electromagnetic signals properties. However, due to the close physical proximity of the cores 120, the three waveguides may experience cross talk where transmitting an electromagnetic signal in one core 120 affects the performance of a neighboring core 120.

Each of the cores 120A-120C includes two ports or ends. Specifically, the core 120A has ports P1 and P2, the core 120B has ports P3 and P4, and the core 120C has ports P5 and P6. As described above, when electromagnetic signals propagate through the cores 120A-120C, leakage occurs into the cladding due to imperfect internal reflections. This leakage can enter the core of a neighboring waveguide and interfere with signals being transmitted in that waveguide which is referred to herein as cross talk. Although the signals are shown as being straight, in other embodiments, the waveguides may curve, which can affect the amount of cross talk between the cores 120A-120C. In FIG. 9, the dielectric constant of the cores 120A-120C is 4.5 at 40 GHZ and the loss is 0.0086. The cladding 110 has a dielectric constant of 2.1 with a loss of 0.001 at 10 GHz.

Figure 10:
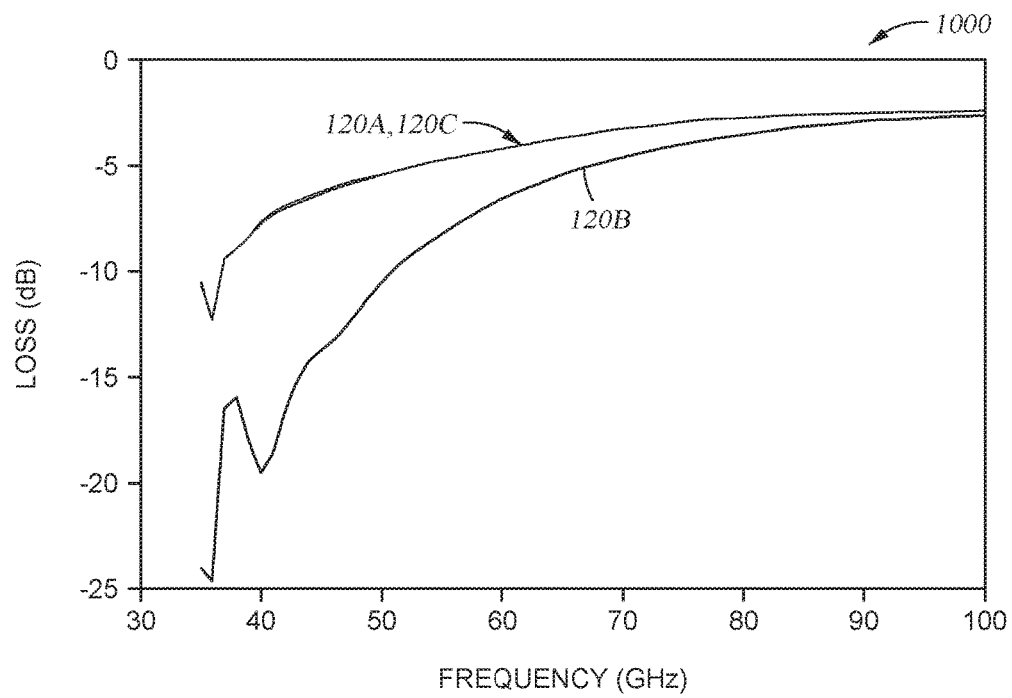
FIG. 10 is a chart illustrating the insertion loss of the waveguides shown in FIG. 9, according to one embodiment described herein.

FIG. 10 is a chart 1000 illustrating the insertion loss of the waveguides shown in FIG. 9, with Frequency (Ghz) along the x-axis and Loss (dB) along the y-axis, according to one embodiment described herein. As shown, the loss in dB of the waveguides having cores 102A and 120C is the same since these waveguides couple only to the one waveguide formed by core 120B. However, the loss of the waveguide formed by core 120B is greater than cores 120A and 120C due to the fact the core 120B couples to both the waveguides formed by the cores 120A and 120C. That is, the core 120B experiences cross talk resulting from being proximate to two waveguides (i.e., cores 120A and 120C) rather than only one waveguide like the cores 120A and 120C which are affected only by their proximity to core 120B.

Figure 11:
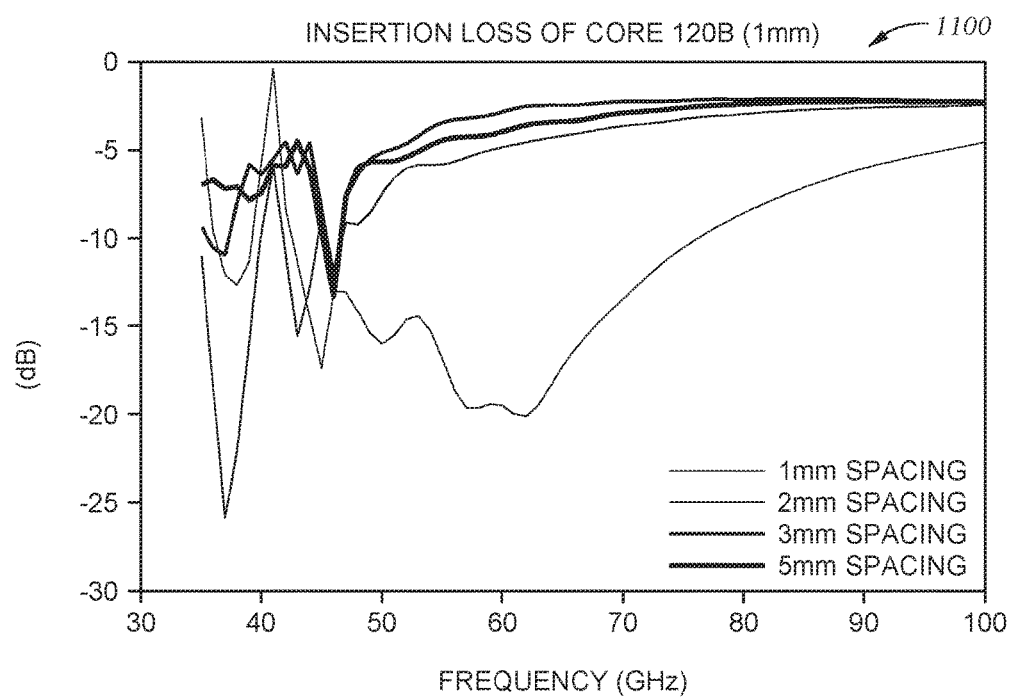
FIG. 11 is a chart illustrating the insertion loss of a waveguide shown in FIG. 9 with a 1 mm core width, according to one embodiment described herein.

FIG. 11 is a chart 1100 illustrating the insertion loss in dB of a waveguide shown in FIG. 9 with a 1 mm core width, according to one embodiment described herein. More specifically, chart 1100 illustrates insertion loss (with Frequency (Ghz) represented along the x-axis) of the center core 120B in FIG. 9 that has a core width of 1 mm. The different thickness plots correspond to different spacing between the center core 120B and the two neighboring cores 120A and 120C. The thinnest plot corresponds to a spacing between the core 120B and the cores 120A, 120C of 1 mm, the second thinnest plot corresponds to a spacing of 2 mm, the second thickest plot corresponds to a spacing of 3 mm and the thickest plot correspond to a spacing of 5 mm.

Generally, the insertion loss for frequencies greater than 45 GHz is much greater for the 1 mm spacing than the other spacing due to the cross talk between the cores 120A-120C. However, as the frequencies get higher, the insertion loss for the other spacings (i.e., 2 mm, 3 mm, and 5 mm) because approximately the same. This is because as the frequencies increase, more of the signal is contained with the core—i.e., does not leak into the cladding—and thus, cross talk has a smaller effect on insertion loss.

Figure 12:
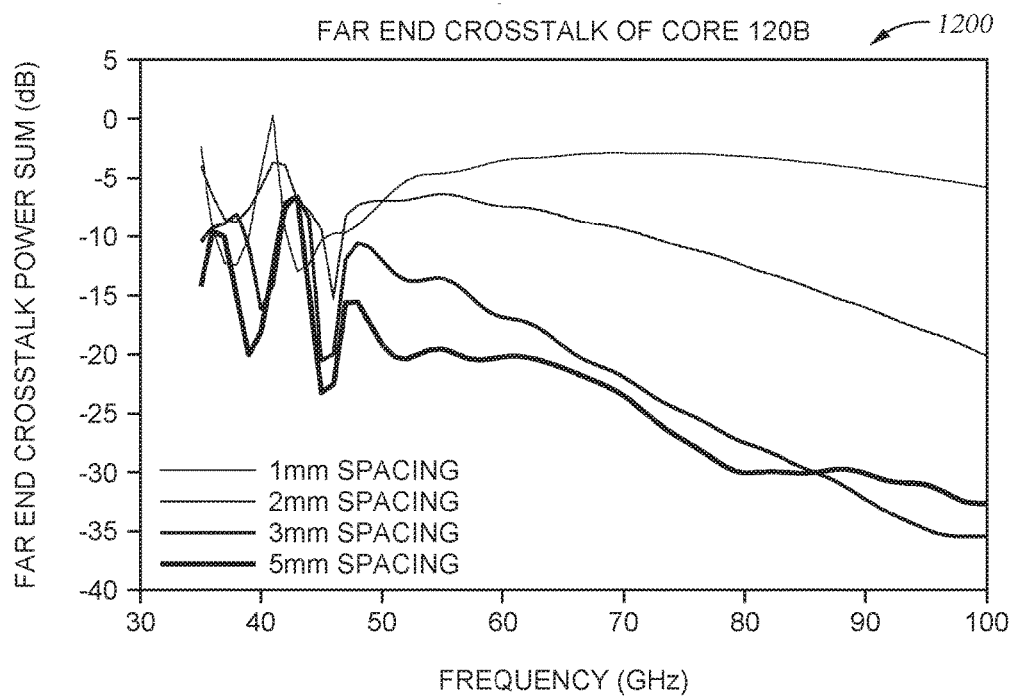
FIG. 12 is a chart illustrating the far end cross talk of a waveguide shown in FIG. 9 with a 1 mm core width, according to one embodiment described herein.

FIG. 12 is a chart 1200 illustrating the far end cross talk of a waveguide shown in FIG. 9 with a 1 mm core 120B width, according to one embodiment described herein. The chart 1200 has an X-axis measured by frequency (GHz) and a Y-axis measured by a far end crosstalk power sum in dB. The far end cross talk for the core 120B is defined as the loss at P4 on the core 120B when a signal is transmitted from P1 on the core 120A at the same time a signal is transmitted from P3 on core 120B. Further, assume that the signals in the cores 120A and 120B propagate in the same direction. Thus, the far end cross talk measures the loss at P4 resulting from propagating a signal from the far end (e.g., P1) on a neighboring waveguide.

Figure 13:
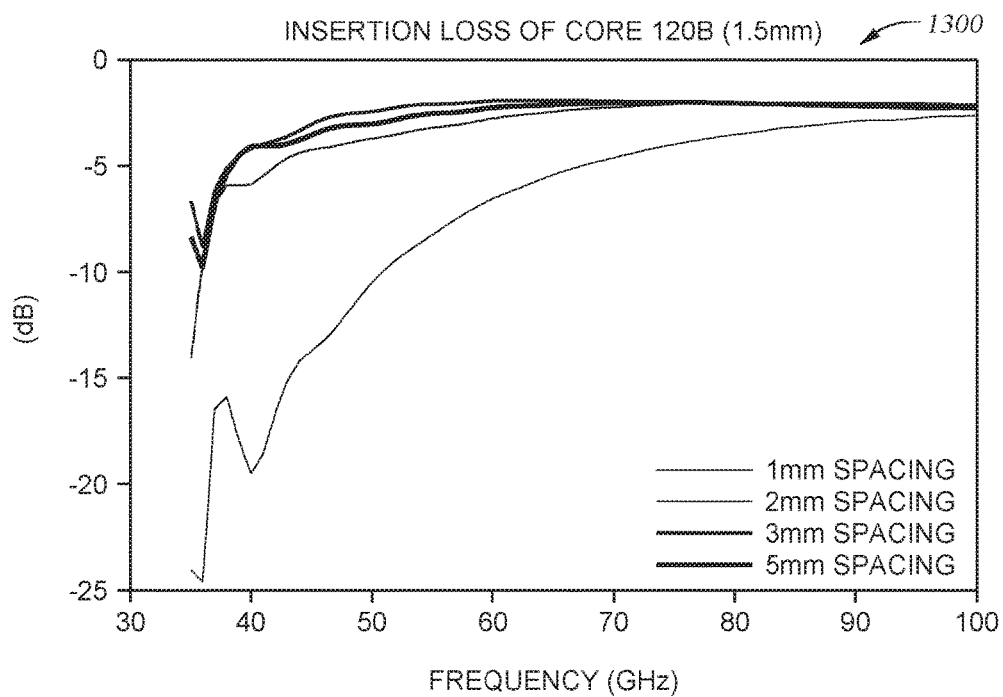
FIG. 13 is a chart illustrating the insertion loss of a waveguide shown in FIG. 9 with a 1.5 mm core width, according to one embodiment described herein.

FIG. 13 is a chart 1300 illustrating the insertion loss in dB of a waveguide shown in FIG. 9 with a 1.5 mm core 120B width with Frequency (Ghz) along the x-axis, according to one embodiment described herein. That is, chart 1300 is measured using the same parameters as FIG. 11 except the widths of the cores 120 in FIG. 9 are increased from 1 mm to 1.5 mm.

Figure 14:
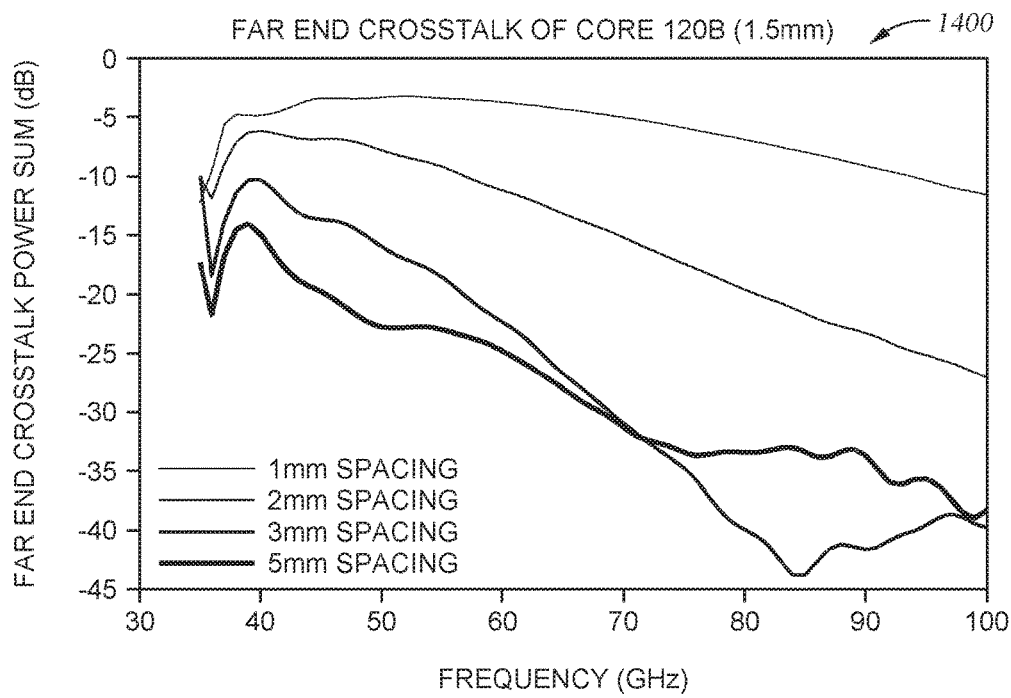
FIG. 14 is a chart illustrating the far end cross talk of a waveguide shown in FIG. 9 with a 1.5 mm core width, according to one embodiment described herein.

FIG. 14 is a chart 1400 illustrating the far end cross talk of a waveguide shown in FIG. 9 with a 1.5 mm core 120B width with Far Crosstalk Power Sum (dB) along the y-axis in relation to Frequency (Ghz) along the x-axis, according to one embodiment described herein. The chart 1400 is measured using the same parameters as FIG. 12 except the widths of the cores 120 in FIG. 9 are increased from 1 mm to 1.5 mm.

Figure 15:
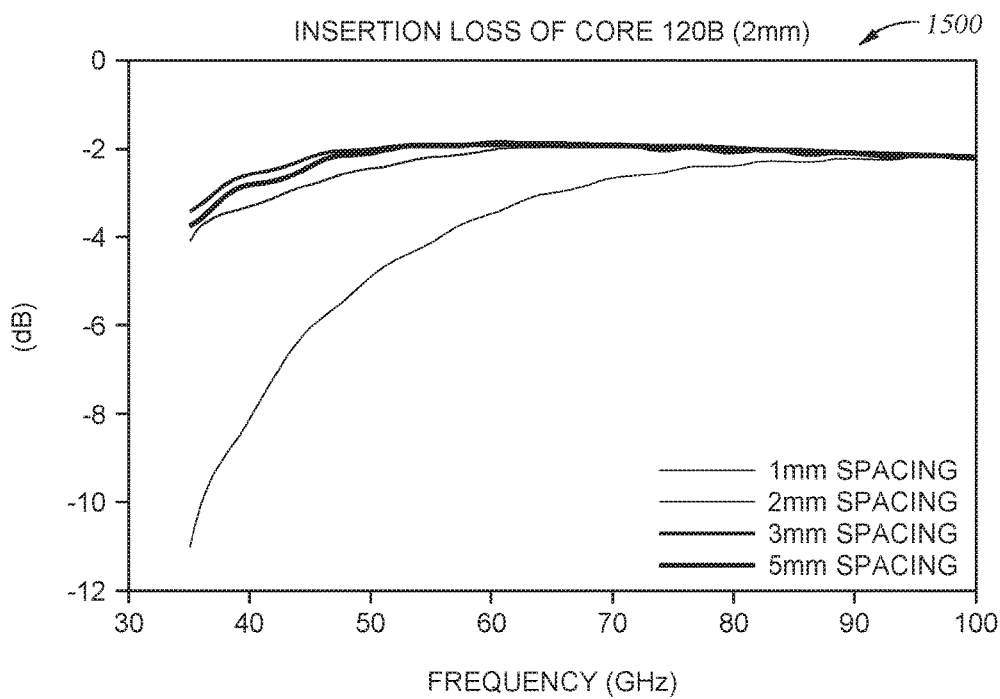
FIG. 15 is a chart illustrating the insertion loss of a waveguide shown in FIG. 9 with a 2 mm core width, according to one embodiment described herein.

FIG. 15 is a chart 1500 illustrating the insertion loss in dB of a waveguide shown in FIG. 9 with a 2 mm core 120B width with Frequency (Ghz) along the x-axis, according to one embodiment described herein. The chart 1500 is measured using the same parameters as FIG. 11 except the widths of the cores 120A-120C in FIG. 9 are increased from 1 mm to 2 mm.

Figure 16:
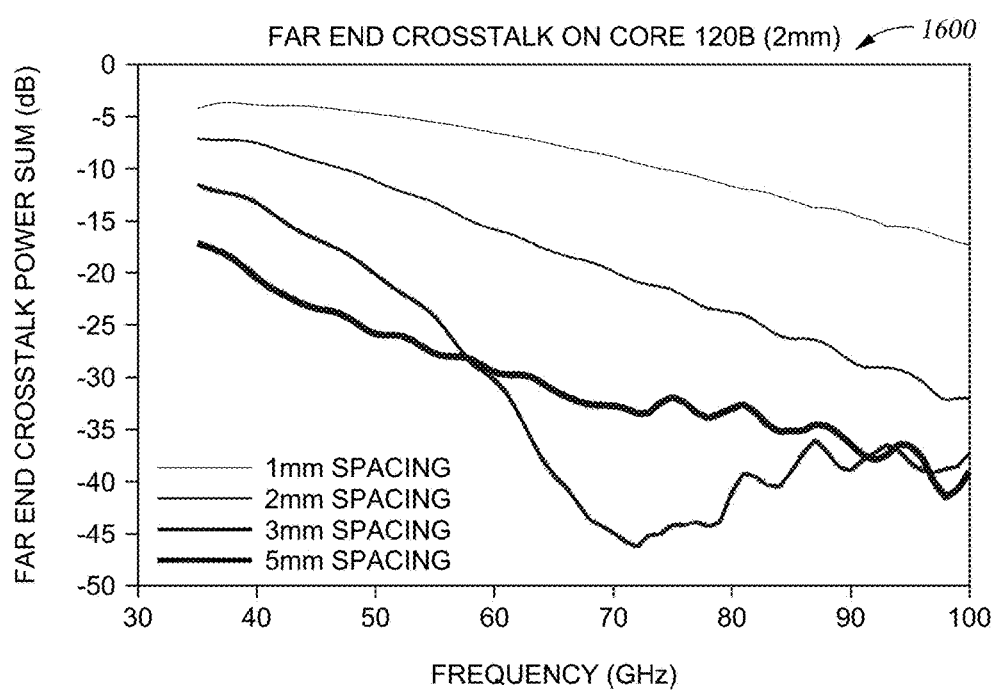
FIG. 16 is a chart illustrating the far end cross talk of a waveguide shown in FIG. 9 with a 2 mm core width, according to one embodiment described herein.

FIG. 16 is a chart 1600 illustrating the far end cross talk of a waveguide shown in FIG. 9 with a 2 mm core 120B width with Far Crosstalk Power Sum (dB along the y-axis in relation to Frequency (Ghz) along the x-axis, according to one embodiment described herein. The chart 1600 is measured using the same parameters as FIG. 12 except the widths of the cores 120A-120c in FIG. 9 are increased from 1 mm to 2 mm.

Figure 17A:
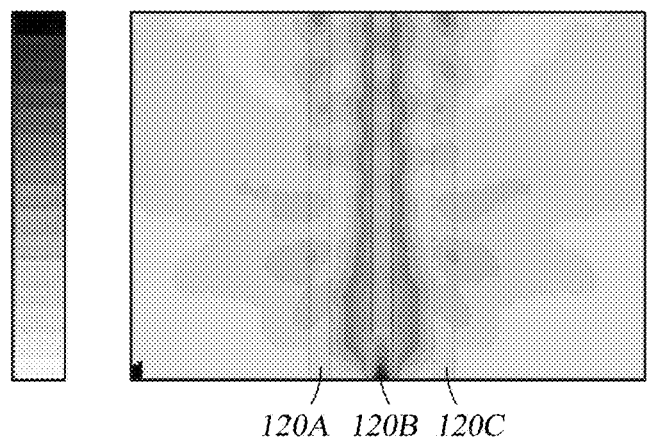
FIGS. 17A-17C illustrate the electric field distribution intensities of the dielectric waveguides in FIG. 9 with different core widths, according to embodiments described herein.
Figure 17B:
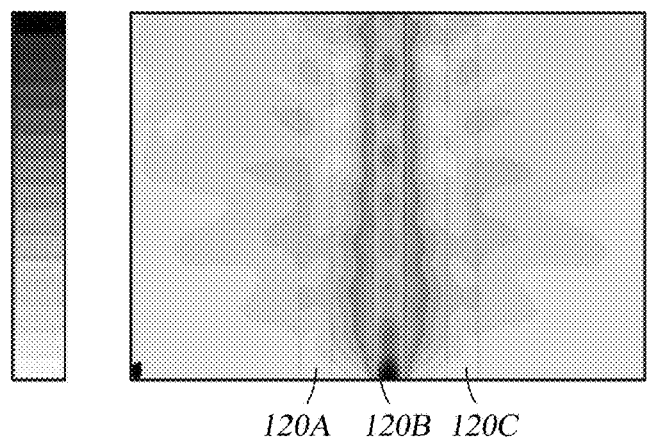
Figure 17C:
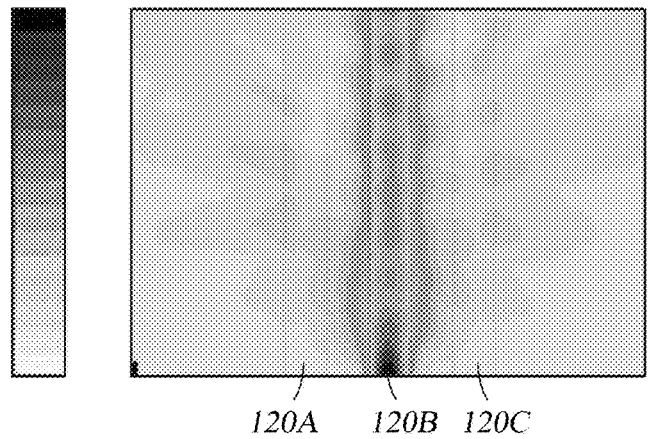

FIGS. 17A-17C illustrate the electric field distribution intensities of the dielectric waveguides in FIG. 9 with different core widths, according to embodiments described herein. In FIG. 17A, the width of each of the cores 120A-120C is 1 mm. In FIG. 17B, the width of each of the cores 120A-120C is 1.5 mm. In FIG. 17C, the width of each of the cores 120A-120C is 2 mm. Moreover, the spacing between the cores 120A-120C is 2 mm. The dark greys in the gradients shown in FIGS. 17A-17C illustrate the portions of the dielectric waveguides that have the greatest intensities of the electromagnetic signal. In FIGS. 17A-17C, a 60 GHz electromagnetic signal is transmitted into the bottom end of the center core 120B. As such, the bottom portion of the center core 120B includes the highest intensity of the electromagnetic signal. However, due to imperfect internal reflections, some of the electromagnetic signal leaks out of the core 120B into the cladding and into the neighboring cores 120A and 120C resulting in cross talk.

When comparing FIGS. 17A-17C, it is clear that using a smaller core width results in greater leakage of the electromagnetic signal into the neighboring cores 120A and 120C which results in cross talk. That is, in FIG. 17A, a greater amount of the intensity of the electromagnetic signal has leaked into the neighboring cores 120A and 120C than in FIGS. 17B and 17C. That is, increasing the widths of the core 120B results in more of the electromagnetic signals being contained in the core 120B. However, increasing the width also decreases that space in the PCB that can be used for routing other dielectric waveguides. That is, there is a tradeoff between increasing the widths of the cores to mitigate cross talk and the waveguide density in a dielectric waveguide layer of the PCB.

Figure 18A:
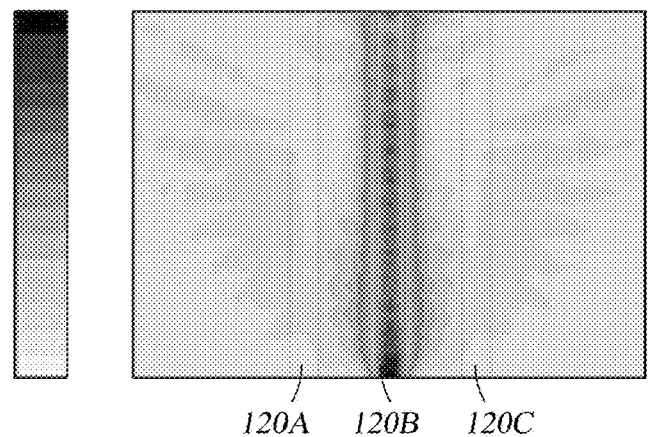
FIGS. 18A-18C illustrate the electric field distribution intensities of the dielectric waveguides in FIG. 9 with different core widths, according to embodiments described herein.
Figure 18B:
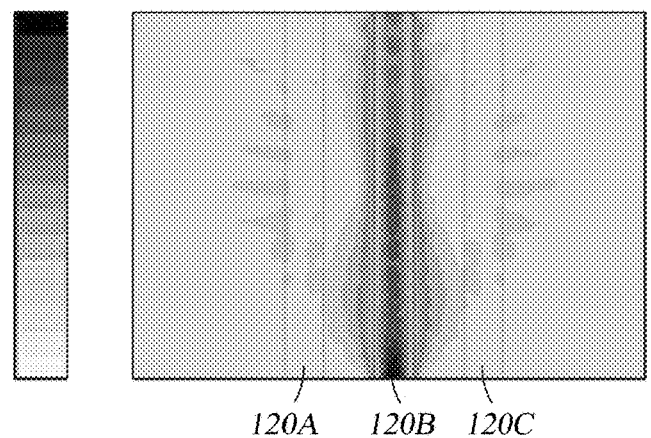
Figure 18C:
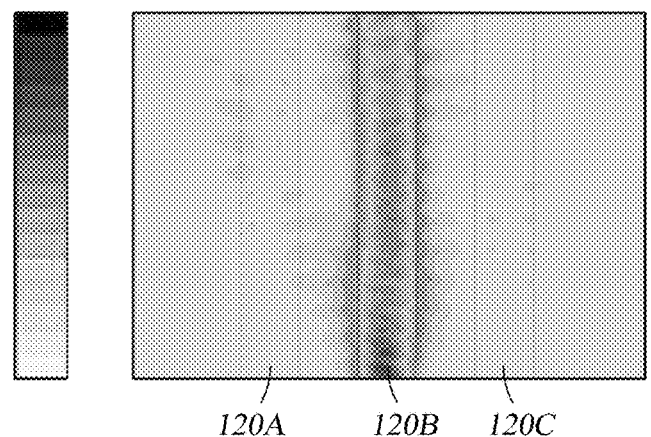
Figure 19A:
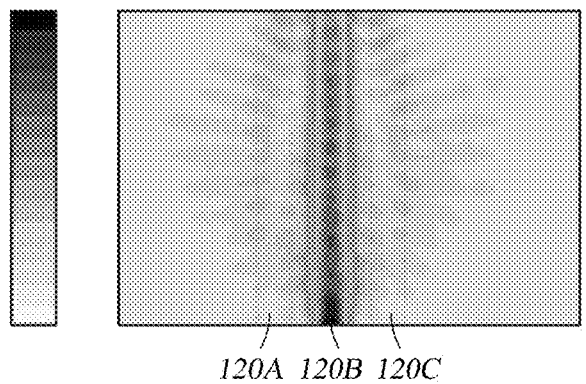
FIGS. 19A-19D illustrate the electric field distribution intensities of the dielectric waveguides in FIG. 9 with different core-to-core spacing, according to embodiments described herein.
Figure 19B:
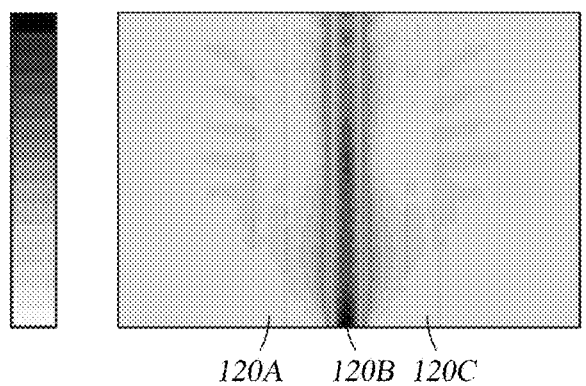
Figure 19C:
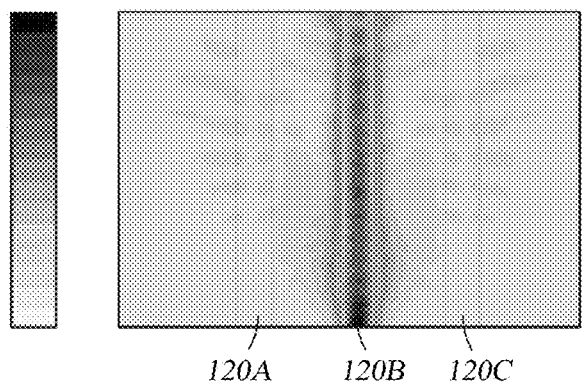
Figure 19D:
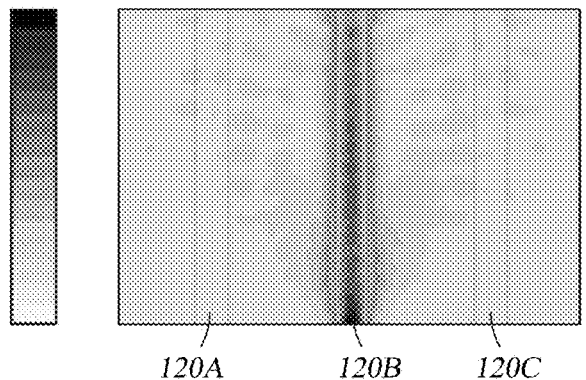
Figure 20A:
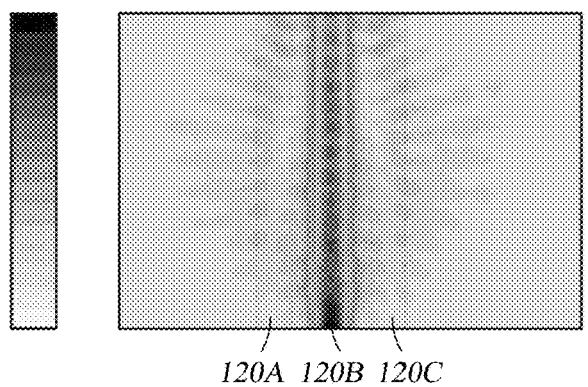
FIGS. 20A-20D illustrate the electric field distribution intensities of the dielectric waveguides in FIG. 9 with different core-to-core spacing, according to embodiments described herein.
Figure 20B:
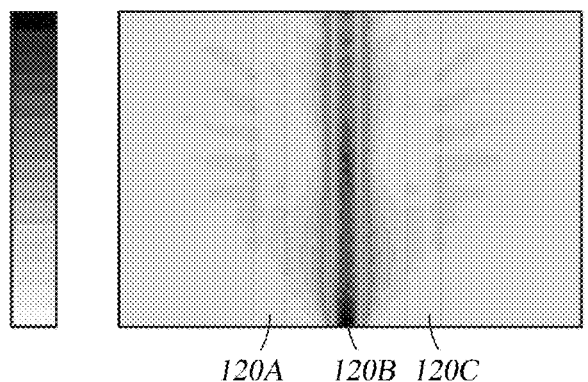
Figure 20C:
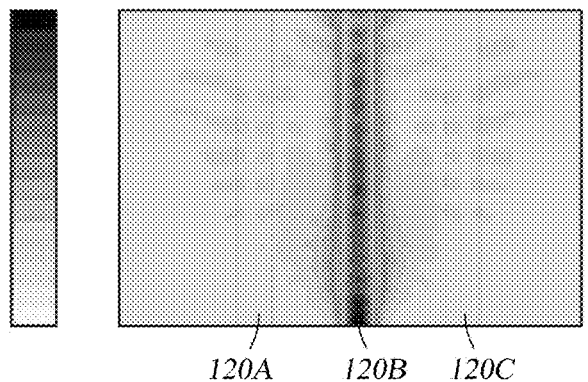
Figure 20D:
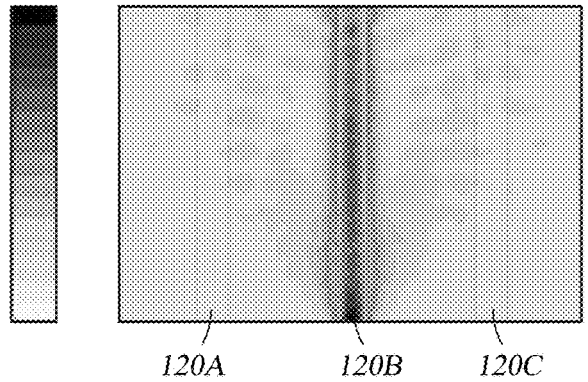

FIGS. 18A-18C illustrate the electric field distribution intensities of the dielectric waveguides in FIG. 9 with different core widths, according to embodiments described herein. In FIG. 18A, the width of each of the cores 120A-120C is 1 mm. In FIG. 18B, the width of each of the cores 120A-120C is 1.5 mm. In FIG. 18C, the width of each of the cores 120A-120C is 2 mm. Moreover, the spacing between the cores 120A-120C is 2 mm. However, instead of transmitting a 60 GHz signal like in FIGS. 17A-17C, in FIGS. 18A-18C a 100 GHz electromagnetic signal is transmitted into the bottom end of the center core 120B.

Comparing FIG. 18A-18C to FIGS. 17A-17C illustrates that less leakage occurs when a higher frequency is transmitted in the core. That is, the cores 120A-120C better contain the higher frequency electromagnetic signal, and thus, less of the signal leaks into the surrounding cladding 110 and the neighboring cores. As a result, the cores 120A-120C in FIGS. 18A-18C experience less cross talk.

FIGS. 19A-19D illustrate the electric field distribution intensities of the dielectric waveguides in FIG. 9 with different core-to-core spacing, according to embodiments described herein. In FIGS. 19A-19D, the widths of the cores 120A-120C remain constant but the spacing between the cores 120A-120C changes. In FIGS. 19A-19D, the spacing between the cores 120A-120C is 1 mm, 2 mm, 3 mm, and 5 mm, respectively. A 60 GHz electromagnetic signal is transmitted into the bottom of the center core 120B. As shown, increasing the spacing between the cores 120A-120C results in less of the intensity of the propagating electromagnetic signal in the core 120B ending up in the neighboring cores 120A and 120C. Thus, FIGS. 19A-19D illustrate that increasing the spacing between cores decreases cross talk.

FIGS. 20A-20D illustrate the electric field distribution intensities of the dielectric waveguides in FIG. 9 with different core-to-core spacing, according to embodiments described herein. The cores 120A-120C in FIGS. 20A-20D have the same arrangement as FIGS. 19A-19D where the widths of the cores 120A-120C are constant (i.e., 2 mm) but the spacing between the cores 120A-120C varies —i.e., 1 mm, 2 mm, 3 mm, and 5 mm, respectively. Moreover, instead of a 60 GHz signal, in FIGS. 20A-20D a 100 GHz signal is transmitted into the bottom end of the center core 120B. Like FIGS. 19A-19D, FIGS. 20A-20D illustrate that increasing the spacing between the cores 120A-120C reduces cross talk. However, with the higher speed signal, the spacing between the cores 120A-120C becomes less important because there is less leakage from the core 120B when transmitting a 100 GHz signal than a 60 GHz signal.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A multi-layer printed circuit board (PCB), comprising:
a first dielectric layer;
a first ground layer comprising a first conductive material;
a dielectric waveguide layer comprising a first core and a cladding, wherein the cladding is disposed on at least two sides of the first core, and wherein an insulative material of the first core has a higher dielectric constant than an insulative material of the cladding;
a second ground layer comprising a second conductive material, wherein the first ground layer is disposed between the first dielectric layer and the dielectric waveguide layer, and wherein the first core and cladding both directly contact the first and second ground layers; and
a plurality of dielectric layers that includes the first dielectric layer, wherein each of the plurality of dielectric layers is separated by a respective one of a plurality of conductive ground layers, wherein the plurality of dielectric layers and the plurality of ground layers are disposed on the first ground layer.

2. The PCB of claim 1, wherein the first core has a first end and a second end, wherein the first core has at least one curve when extending between the first and second ends in the dielectric waveguide layer.

3. The PCB of claim 2, wherein the at least one curve forms an arc with an arc radius that is equal to or greater than $25/\pi$.

4. The PCB of claim 1, wherein the dielectric waveguide layer includes a second core extending in a common direction as the first core in the dielectric waveguide layer, wherein the cladding is disposed on at least two sides of the second core, and wherein an insulative material of the second core has a higher dielectric constant than the insulative material of the cladding,
wherein the second core directly contacts the first and second ground layers.

5. The PCB of claim 4, wherein a spacing between the first core and the second core in the dielectric waveguide layer is always greater than 1 mm.

6. The PCB of claim 1, wherein first and second coaxial vias extend through the plurality of dielectric layers and the plurality of ground layers to couple to respective ends of the first core, wherein the first and second coaxial vias each comprises a respective center conductor and a corresponding outer conductor surrounding the center conductor.

7. The PCB of claim 6, wherein the outer conductors of the first and second coaxial vias are electrically coupled to the plurality ground layers and the center conductors of the first and second coaxial vias are electrically insulated from the plurality of ground layers.

8. A PCB, comprising:
a first dielectric layer;
a first ground layer comprising a first conductive material;
a dielectric waveguide layer comprising a first core and a cladding, wherein the cladding is disposed on at least two sides of the first core, and wherein an insulative material of the first core has a higher dielectric constant than an insulative material of the cladding; and
a second ground layer comprising a second conductive material, wherein the first ground layer is disposed between the first dielectric layer and the dielectric waveguide layer, and wherein the first core and cladding both directly contact the first and second ground layers, wherein a width of the first core is between 0.1 to 2 mm and is configured to transmit electromagnetic signals with a frequency between 10 GHz to 150 GHz.

9. A communication system, comprising:
a multi-layer PCB, comprising:
   a first dielectric layer,
   a first ground layer comprising a first conductive material,
   a dielectric waveguide layer comprising a first core and a cladding, wherein the cladding is disposed on at least two sides of the first core, and wherein an insulative material of the first core has a higher dielectric constant than an insulative material of the cladding, wherein the first core has a first end and a second end, wherein the first core has at least one curve when extending between the first and second ends in the dielectric waveguide layer, wherein the at least one curve forms an arc with an arc radius that is equal to or greater than $25/\pi$, and
   a second ground layer comprising a second conductive material, wherein the first ground layer is disposed between the first dielectric layer and the dielectric waveguide layer, and wherein the first core and cladding both directly contact the first and second ground layers;
a first application specific integrated circuit (ASIC) coupled to the multi-layered PCB, the first ASIC is configured to transmit an electromagnetic signal into the first core; and
a second ASIC coupled to the multi-layered PCB, the second ASIC is configured to receive the electromagnetic signal from the first core.

10. The communication system of claim 9, wherein the multi-layer PCB further comprises:
   a plurality of dielectric layers that includes the first dielectric layer, wherein each of the plurality of dielectric layers is separated by a respective one of a plurality of conductive ground layers, wherein the plurality of dielectric layers and the plurality of ground layers are disposed on the first ground layer.

11. The communication system of claim 10, wherein first and second coaxial vias extend through the plurality of dielectric layers and the plurality of ground layers, wherein the first and second coaxial vias each comprises a respective center conductor and a corresponding outer conductor surrounding the center conductor, and wherein a first end of the center conductors is coupled to one of the first and second ASICs and a second end of the center conductors is coupled to the first core.

12. The communication system of claim 11, wherein the outer conductors of the first and second coaxial vias are electrically coupled to the plurality ground layers and the center conductors of the first and second coaxial vias are electrically insulated from the plurality of ground layers.

13. The communication system of claim 11, wherein the first and second ASICs are disposed on a same side of the multi-layer PCB that is parallel to the dielectric waveguide layer.

14. The communication system of claim 11, wherein the first and second ASICs are coupled to the first and second coaxial vias using respective solder bonds.

15. The communication system of claim 9, wherein a width of the first core is between 0.1 to 2 mm and is configured to transmit electromagnetic signals with a frequency between 10 GHz to 150 GHz between the first and second ASICs.

16. The communication system of claim 9, wherein the dielectric waveguide layer includes a second core extending in a common direction as the first core in the dielectric waveguide layer, wherein the cladding is disposed on at least two sides of the second core, and wherein an insulative material of the second core has a higher dielectric constant than the insulative material of the cladding,
   wherein the second core directly contacts the first and second ground layers.

17. The communication system of claim 16, wherein a spacing between the first core and the second core in the dielectric waveguide layer is always greater than 1 mm.

* * * * *